(12) United States Patent
Shin et al.

(10) Patent No.: US 9,666,552 B2
(45) Date of Patent: May 30, 2017

(54) SEMICONDUCTOR DEVICE CONNECTED BY ANISOTROPIC CONDUCTIVE FILM

(71) Applicants: Young Ju Shin, Uiwang-si (KR); Kyu Bong Kim, Uiwang-si (KR); Hyun Joo Seo, Uiwang-si (KR); Kyoung Hun Shin, Uiwang-si (KR); Woo Jun Lim, Uiwang-si (KR)

(72) Inventors: Young Ju Shin, Uiwang-si (KR); Kyu Bong Kim, Uiwang-si (KR); Hyun Joo Seo, Uiwang-si (KR); Kyoung Hun Shin, Uiwang-si (KR); Woo Jun Lim, Uiwang-si (KR)

(73) Assignee: CHEIL INDUSTRIES, INC., Gumi-Si, Kyeongsangbuk-Do (KR)

( * ) Notice: Subject to any disclaimer, the term of this patent is extended or adjusted under 35 U.S.C. 154(b) by 0 days.

(21) Appl. No.: 14/071,999

(22) Filed: Nov. 5, 2013

(65) Prior Publication Data
US 2014/0124931 A1 May 8, 2014

(30) Foreign Application Priority Data
Nov. 6, 2012 (KR) .......................... 10-2012-0124621

(51) Int. Cl.
*H01L 23/00* (2006.01)
*C09J 9/02* (2006.01)

(52) U.S. Cl.
CPC ............... *H01L 24/29* (2013.01); *C09J 9/02* (2013.01); *H01L 24/32* (2013.01); *H01L 24/83* (2013.01); *H01L 2224/293* (2013.01); *H01L 2224/294* (2013.01); *H01L 2224/2929* (2013.01); *H01L 2224/2939* (2013.01); *H01L 2224/29339* (2013.01); *H01L 2224/29344* (2013.01); *H01L 2224/29347* (2013.01); *H01L 2224/29355* (2013.01); *H01L 2224/32225* (2013.01); *H01L 2224/81191* (2013.01); *H01L 2224/83851* (2013.01); *H01L 2924/07802* (2013.01); *H01L 2924/07811* (2013.01)

(58) Field of Classification Search
None
See application file for complete search history.

(56) References Cited

U.S. PATENT DOCUMENTS

| 2007/0001313 A1* | 1/2007 | Fujimoto et al. ............. 257/778 |
| 2009/0000807 A1* | 1/2009 | Han et al. ..................... 174/250 |
| 2011/0110066 A1* | 5/2011 | Yamada et al. ............... 361/803 |
| 2011/0120767 A1* | 5/2011 | Sato et al. .................. 174/84 R |
| 2012/0292082 A1* | 11/2012 | Miyauchi et al. ............ 174/250 |

FOREIGN PATENT DOCUMENTS

| CN | 101589514 A | 11/2009 |
| JP | 62177082 A * | 8/1997 ............... C09J 9/00 |
| JP | 2010-037539 A | 2/2010 |

OTHER PUBLICATIONS

Hazewinkel, M., —"Normal Distribution", in Encyclopedia of Mathematics, 4 pages—2010.*

* cited by examiner

*Primary Examiner* — Johannes P Mondt
(74) *Attorney, Agent, or Firm* — Lee & Morse, P.C.

(57) ABSTRACT

A semiconductor device connected by an anisotropic conductive film, the anisotropic conductive film including a polyurethane resin; at least one other resin selected from the group of an ethylene-vinyl acetate copolymer resin, an acrylonitrile resin, and a styrene resin; isobornyl acrylate; and conductive particles.

9 Claims, 1 Drawing Sheet

SEMICONDUCTOR DEVICE CONNECTED BY ANISOTROPIC CONDUCTIVE FILM

CROSS-REFERENCE TO RELATED APPLICATION

Korean Patent Application No. 10-2012-0124621 filed on Nov. 6, 2012, in the Korean Intellectual Property Office, and entitled: "SEMICONDUCTOR DEVICE CONNECTED BY ANISOTROPIC CONDUCTIVE FILM," is incorporated by reference herein in its entirety.

BACKGROUND

1. Field

Embodiments relate to a semiconductor device connected by an anisotropic conductive film.

2. Description of the Related Art

Anisotropic conductive films (ACFs) may refer to film-shaped adhesives in which conductive particles, e.g., metal particles including nickel or gold particles or metal-coated polymer particles, are dispersed in a resin, e.g., an epoxy resin. Anisotropic conductive films, which may be formed of polymer layers having electric anisotropy and adhesiveness, may exhibit conductive properties in a thickness direction of the films and insulating properties in a surface or lateral direction thereof.

When an anisotropic conductive film is disposed between circuit boards to be connected and is subjected to heating and compression under certain conditions, circuit terminals of the circuit boards may be electrically connected through conductive particles, and an insulating adhesive resin may fill spaces between adjacent circuit terminals to isolate the conductive particles from each other, thereby providing high insulation performance between the circuit terminals.

SUMMARY

Embodiments are directed to a semiconductor device connected by an anisotropic conductive film.

The embodiments may be realized by providing a semiconductor device connected by an anisotropic conductive film, the anisotropic conductive film including a polyurethane resin; at least one other resin selected from the group of an ethylene-vinyl acetate copolymer resin, a acrylonitrile resin, and a styrene resin; isobornyl acrylate; and conductive particles.

The polyurethane resin, the at least one other resin, and the isobornyl acrylate may be present in a ratio (X/Y) of a total weight (X) of the polyurethane resin, the at least one other resin, and the isobornyl acrylate to a weight (Y) of the isobornyl acrylate in a range of about 3 to about 20, in terms of solid content.

Unevenness on a rear side of a compressed surface of the anisotropic conductive film may have a maximum height of about 2 μm or more, when the anisotropic conductive film is compressed onto an adherend.

The unevenness may have an average height of about 0.4 μm or more.

The adherend may be a printed circuit board.

A total amount of the polyurethane resin and the at least one other resin in the anisotropic conductive film may be about 60 wt % to about 90 wt %, based on a total weight of the anisotropic conductive film in terms of solid content.

The isobornyl acrylate may be present in the anisotropic conductive film in an amount of about 1 wt % to about 25 wt %, based on a total weight of the anisotropic conductive film in terms of solid content.

The anisotropic conductive film may include about 30 wt % to about 80 wt % of the polyurethane resin; about 1 wt % to about 40 wt % of the at least one other resin selected from the group of an ethylene-vinyl acetate copolymer resin, an acrylonitrile resin, and a styrene resin; about 1 wt % to about 25 wt % of the isobornyl acrylate; and about 0.1 wt % to about 15 wt % of the conductive particles, all amounts being in terms of solid content.

The anisotropic conductive film may further include organic particles or inorganic particles.

The organic particles or inorganic particles may be present in the anisotropic conductive film in an amount of about 1 wt % to about 30 wt %, based on a total weight of the anisotropic conductive film in terms of solid content.

The anisotropic conductive film may have an adhesive strength of about 900 gf/cm or more, as measured after primary compression at about 110° C. to about 150° C. for about 1 to about 7 seconds under a load of about 1.0 MPa to about 4.0 MPa.

The anisotropic conductive film may have an adhesive strength of about 800 gf/cm or more, as measured after being subjected to the primary compression and then left at 85° C. and 85% RH (Relative Humidity) for 500 hours.

The embodiments may also be realized by providing a semiconductor device connected by an anisotropic conductive film, wherein unevenness on a rear side of a compressed surface of the anisotropic conductive film has a maximum height of about 2 μm or more, when the anisotropic conductive film is compressed onto an adherend, and the anisotropic conductive film includes isobornyl acrylate and conductive particles.

The unevenness may have an average height of about 0.4 μm or more.

The anisotropic conductive film may include a polyurethane resin; at least one other resin selected from the group of an ethylene-vinyl acetate copolymer resin, a acrylonitrile resin, and a styrene resin; the isobornyl acrylate; and the conductive particles.

The polyurethane resin, the at least one other resin, and the isobornyl acrylate may be present in a ratio (X/Y) of a total weight (X) of the polyurethane resin, the at least one other resin, and the isobornyl acrylate to a weight (Y) of the isobornyl acrylate in a range of about 3 to about 20, in terms of solid content.

The embodiments may also be realized by providing a semiconductor device including a first connecting member including a first electrode; a second connecting member including a second electrode; and an anisotropic conductive film between the first connecting member and the second connecting member, the anisotropic conductive film connecting the first electrode and the second electrode to each other and including a polyurethane resin; at least one other resin selected from the group of an ethylene-vinyl acetate copolymer resin, a acrylonitrile resin, and a styrene resin; isobornyl acrylate; and conductive particles, wherein the polyurethane resin, the at least one other resin, and the isobornyl acrylate are present in a ratio (X/Y) of a total weight (X) of the polyurethane resin, the at least one other resin, and the isobornyl acrylate to a weight (Y) of the isobornyl acrylate in a range of about 3 to about 20, in terms of solid content, and wherein unevenness on a rear side of a compressed surface of the anisotropic conductive film has a maximum height of about 2 µm or more, when the anisotropic conductive film is compressed onto an adherend.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
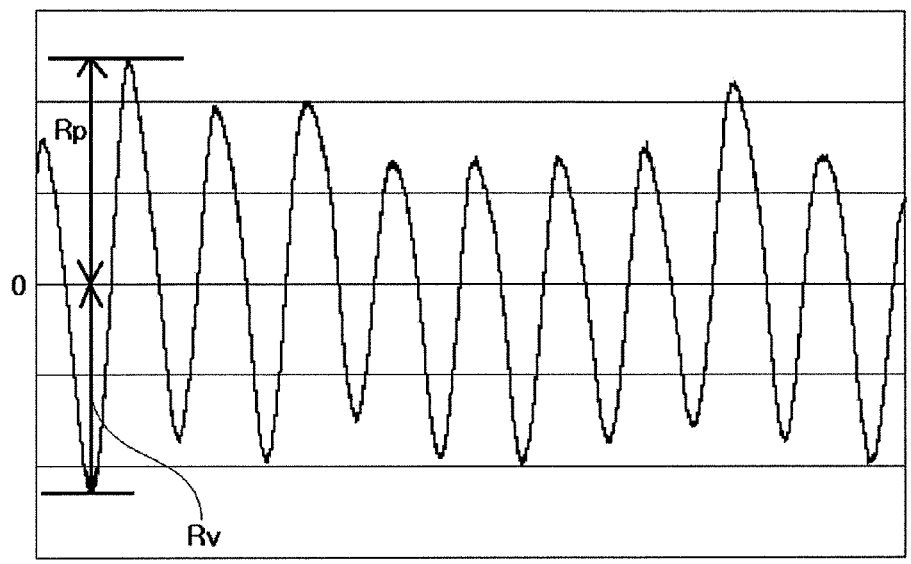
FIG. 1 illustrates a graph depicting variation of unevenness, as obtained using a surface shape measuring apparatus (Surface Profiler) upon evaluation of an indentation state of a surface of an anisotropic conductive film.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

The embodiments relate to a semiconductor device connected by an anisotropic conductive film, the film being capable of being rapidly cured at low temperature and exhibiting an excellent indentation state after compressing.

One embodiment provides a semiconductor device connected by an anisotropic conductive film. The anisotropic conductive film may include, e.g., (a) a polyurethane resin; (b) at least one other resin selected from the group of an ethylene-vinyl acetate copolymer resin, a acrylonitrile resin, and a styrene resin; (c) isobornyl acrylate; and (d) conductive particles.

In an implementation, in the anisotropic conductive film, the (a) polyurethane resin, the (b) at least one other resin selected from the group of an ethylene-vinyl acetate copolymer resin, a acrylonitrile resin, and a styrene resin, and the (c) isobornyl acrylate may be included in a ratio (X/Y) of a total weight (X) of (a), (b), and (c) to a weight (Y) of (c) in a range of about 3 to about 20, in terms of solid content.

In an implementation, the ratio (X/Y) of a total weight (X) of (a), (b), and (c) to a weight (Y) of (c) may be about 5 to about 20, e.g., about 5 to about 18.

Within this range of the weight ratio (X/Y), the anisotropic conductive film may exhibit increased adhesive strength upon bonding at low temperature to help improve adhesion and connection resistance not only at an initial stage, but also after reliability testing. Accordingly, the anisotropic conductive film may easily act as an adhesive film. In addition, the anisotropic conductive film may achieve uniform distribution of pressure applied to a surface thereof upon compression. Thus, uniform indentations may be formed on the compressed surface of the anisotropic conductive film.

Next, the respective components of the anisotropic conductive film according to an embodiment will be described in more detail. As used herein, the content of each component is based on the total weight of the anisotropic conductive film or anisotropic conductive film composition. Further, in preparation of the anisotropic conductive film, each of the components may be dissolved in an organic solvent and deposited onto a release film, followed by drying for a predetermined period of time for evaporation of the organic solvent. Thus, a solid anisotropic conductive film may also contain the respective components of the anisotropic conductive film composition.

a) Polyurethane Resin

The polyurethane resin may include a urethane bond and may be prepared through polymerization of, e.g., isophorone diisocyanate, polytetramethylene glycol, or the like.

The polyurethane resin may be present in the anisotropic conductive film or composition in an amount of about 30% by weight (wt %) to about 80 wt %, e.g., about 40 wt % to about 80 wt % or about 50 to about 75 wt %, based on a total weight of the anisotropic conductive film or composition in terms of solid content.

Within this content range, an anisotropic conductive film or anisotropic conductive film composition may have improved flowability, thereby improving connection properties, long-term connection reliability, film strength, and thermal resistance.

In addition, the polyurethane resin may have a weight average molecular weight of about 5,000 g/mol to about 300,000 g/mol, e.g., about 10,000 g/mol to about 300,000 g/mol.

In an implementation, the polyurethane resin may be a polyurethane acrylate resin. For example, the polyurethane acrylate resin may include diisocyanates, polyols, diols, and/or (meth)acrylates.

Diisocyanate

According to an embodiment, a suitable diisocyanate may be used. Examples of diisocyanates may include aromatic, aliphatic, alicyclic diisocyanates, or mixtures thereof. In an implementation, the diisocyanates may include tetramethylene-1,4-diisocyanate, hexamethylene-1,6-diisocyanate, cyclohexylene-1,4-diisocyanate, methylenebis(4-cyclohexyldiisocyanate), isophorone diisocyanate, 4,4-methylenebis (cyclohexyldiisocyanate), or the like. These may be used alone or in combination thereof.

Polyol

According to an embodiment, a suitable polyol may be used. Examples of polyols may include polyester polyol, polyether polyol, polycarbonate polyol, or the like.

The polyester polyol may be obtained through condensation of a dicarboxylic acid compound and a diol compound.

According to an embodiment, a suitable dicarboxylic acid compound may be used. Examples of the dicarboxylic acid compound may include succinic acid, glutaric acid, isophthalic acid, adipic acid, suberic acid, azelaic acid, sebacic acid, dodecanedicarboxylic acid, hexahydrophthalic acid, isophthalic acid, terephthalic acid, ortho-phthalic acid, tetrachlorophthalic acid, 1,5-naphthalenedicarboxylic acid, fumaric acid, maleic acid, itaconic acid, citraconic acid, mesaconic acid, tetrahydrophthalic acid, and the like. These may be used alone or in combination thereof.

In addition, a suitable diol compound may be used. Examples of the diol compound may include ethylene glycol, propylene glycol, 1,3-propanediol, 1,3-butanediol, 1,4-butanediol, 1,5-pentanediol, 1,6-hexanediol, neopentyl glycol, diethylene glycol, dipropylene glycol, triethylene glycol, tetraethylene glycol, dibutylene glycol, 2-methyl-1, 3-pentanediol, 2,2,4-trimethyl-1,3-pentanediol, 1,4-cyclohexanedimethanol, and the like. These may be used alone or in combination thereof.

Examples of the polyether polyol may include polyethylene glycol, polypropylene glycol, polytetraethylene glycol, and the like. These may be used alone or in combination thereof.

Examples of the polycarbonate polyol may include polyalkylene carbonate, silicone-derived polycarbonate polyols, and the like. These may be used alone or in combination thereof.

Diol

In addition, a suitable diol may be used. Examples of diols may include 1,3-propanedoil, 1,3-butanediol, 1,4-butanediol, 1,5-pentanediol, 1,6-hexanediol, neopentyl glycol, diethylene glycol, dipropylene glycol, triethylene glycol, tetraethylene glycol, dibutylene glycol, 2-methyl-1,3-pentanediol, 2,2,4-trimethyl-1,3-pentanediol, 1,4-cyclohexanedimethanol, and the like. These may be used alone or in combination thereof.

(Meth)Acrylate

The (meth)acrylate may include hydroxy(meth)acrylate or amine (meth)acrylate.

b) Other Resin

The anisotropic conductive film may include at least one other resin, the other resin being selected from the group of an ethylene-vinyl acetate copolymer resin, an acrylonitrile resin, and a styrene resin. As the binder resin, the at least one other resin selected from the group of an ethylene-vinyl acetate copolymer resin, an acrylonitrile resin, and a styrene resin may be used, in addition to the polyurethane resin.

The other resin selected from the group of an ethylene-vinyl acetate copolymer resin, an acrylonitrile resin, and a styrene resin may be present in the anisotropic conductive film or composition in an amount of about 1 wt % to about 40 wt %, e.g., about 1 wt % to about 30 wt % or about 1 wt % to about 25 wt %, based on the total weight of the anisotropic conductive film or composition in terms of solid content.

Within this range, the anisotropic conductive film or composition may be suitably adjusted to a low melt viscosity at low temperature to help improve flowability of the composition, thereby facilitating efficient filling of the composition between fine electrodes.

Ethylene-Vinyl Acetate Copolymer (EVA) Resin

According to an embodiment, a suitable ethylene-vinyl acetate copolymer resin may be used.

In the ethylene-vinyl acetate copolymer resin, the vinyl acetate may be present in an amount of 10 parts by weight to 50 parts by weight, based on 100 parts by weight of the ethylene-vinyl acetate copolymer resin.

Polymerization of the ethylene-vinyl acetate copolymer resin may be performed by a suitable method.

The ethylene-vinyl acetate copolymer resin may be present in the anisotropic conductive film or composition in an amount of about 1 wt % to about 40 wt %, e.g., about 1 wt % to about 30 wt % or about 1 wt % to about 25 wt %, based on the total weight of the anisotropic conductive film in terms of solid content. Within this content range, the anisotropic conductive film or composition may be suitably adjusted to have a low melt viscosity at low temperature to help improve flowability of the film composition, thereby facilitating efficient filling of the film composition between fine electrodes.

Acrylonitrile Resin

According to an embodiment, a suitable acrylonitrile resin may be used.

For example, an acrylonitrile butadiene rubber (NBR) resin may be used.

Acrylonitrile butadiene rubber resin is a copolymer prepared through polymerization of acrylonitrile and butadiene. Neither the content of each of acrylonitrile and butadiene in the copolymer, nor the weight average molecular weight of the copolymer is not particularly limited.

Polymerization of the acrylonitrile butadiene rubber resin may be performed by a suitable method, e.g., emulsion polymerization.

The acrylonitrile resin may be present in the anisotropic conductive film or composition in an amount of about 1 wt % to about 40 wt %, e.g., about 1 wt % to about 30 wt % or about 1 wt % to about 25 wt %, based on the total weight of the anisotropic conductive film or composition in terms of solid content.

Within this content range, it is possible to secure excellent adhesive strength.

Styrene Resin

According to an embodiment, a suitable styrene resin may be used. For example, the styrene resin may include an aromatic vinyl copolymer resin, a rubber-modified styrene copolymer resin, or the like.

Examples of the aromatic vinyl copolymer resin may include styrene, α-methylstyrene, halogen or alkyl-substituted styrene or mixtures thereof, and vinyl copolymers or mixtures of the vinyl copolymers prepared by copolymerization of, e.g., acrylonitrile, methacrylonitrile, $C_1$-$C_8$ alkyl methacrylates, $C_1$-$C_8$ alkyl acrylates, maleic anhydride, $C_1$-$C_4$ alkyl or phenyl nucleus-substituted maleimides or mixtures thereof.

Examples of the $C_1$-$C_8$ alkyl methacrylates or $C_1$-$C_8$ alkyl acrylates may include methyl methacrylate, ethyl methacrylate, methyl acrylate, ethyl acrylate, propyl methacrylate, and the like.

Examples of the aromatic vinyl copolymer resin may include resins prepared from a monomer mixture of styrene, acrylonitrile and methyl methacrylate; a mixture of α-methylstyrene, acrylonitrile and methyl methacrylate; and a mixture of styrene, α-methylstyrene, acrylonitrile and methyl methacrylate. These may be used alone or in combination thereof.

Polymerization of the aromatic vinyl copolymer resin may be performed by a suitable method, e.g., emulsion polymerization, suspension polymerization, solution polymerization, bulk polymerization, or the like.

The aromatic vinyl copolymer resin may have a weight average molecular weight of about 50,000 g/mol to about 500,000 g/mol, e.g., about 50,000 g/mol to about 300,000 g/mol.

The rubber-modified styrene copolymer resin may be a copolymer resin in which grafted rubber phase polymers are dispersed in powder form in a continuous phase of copolymers of vinyl monomers, and may be prepared by adding an aromatic vinyl monomer and a vinyl monomer copolymerizable with the aromatic vinyl monomer in the presence of the rubber phase polymer, followed by polymerization.

Examples of the rubber-modified styrene copolymer resin may include acrylonitrile-butadiene-styrene copolymers (ABS), acrylonitrile-styrene-acryl rubber copolymers (ASA), acrylonitrile-ethylene propylene rubber-styrene copolymers (AES), methyl methacrylate-butadiene-styrene copolymers (MBS), and the like. These may be used alone or in combination thereof.

The styrene resins may be present in the anisotropic conductive film or composition in an amount of about 1 wt % to about 40 wt %, e.g., about 1 wt % to about 30 wt % or about 1 wt % to about 25 wt %, based on the total weight of the anisotropic conductive film or composition in terms of solid content.

Within this content ratio, the anisotropic conductive film may maintain high reliability under high temperature and high humidity conditions.

c) Isobornyl Acrylate

As a radical polymerization material, the anisotropic conductive film may include isobornyl acrylate.

When used as the radical polymerization material for the anisotropic conductive film, isobornyl acrylate may help promote curing of the binder resin, thereby reducing curing temperature and curing time.

In addition to isobornyl acrylate, other radical polymerization materials may be included in the anisotropic conductive film or composition. Examples of other radical polymerization materials may include methyl (meth)acrylate, ethyl (meth)acrylate, n-butyl (meth)acrylate, isobutyl (meth)acrylate, t-butyl (meth)acrylate, 2-ethylhexyl (meth)acrylate, isodecyl (meth)acrylate, n-lauryl (meth)acrylate, C12-C15 alkyl (meth)acrylates, n-stearyl (meth)acrylate, n-butoxyethyl (meth)acrylate, butoxy diethylene glycol (meth)acrylate, methoxy triethylene glycol (meth)acrylate, methoxy polyethylene glycol (meth)acrylate, cyclohexyl (meth)acrylate, tetrahydrofurfuryl(meth)acrylate, benzyl (meth)acrylate, 2-phenoxyethyl (meth)acrylate, 2-hydroxyethyl (meth)acrylate, 2-hydroxypropyl (meth)acrylate, 2-hydroxybutyl (meth)acrylate, 4-hydroxybutyl (meth)acrylate, dimethylaminoethyl (meth)acrylate, diethylaminoethyl (meth)acrylate, (meth)acrylic acid, 2-(meth)acryloyloxyethyl succinic acid, 2-(meth)acryloyloxyethyl hexahydrophthalate, 2-(meth)acryloyloxyethyl-2-hydroxypropylphthalate, glycidyl (meth)acrylate, 2-(meth)acryloyloxyethyl acid phosphate, ethylene glycol di(meth)acrylate, diethylene glycol di(meth)acrylate, triethylene glycol di(meth)acrylate, 1,4-butanediol di(meth)acrylate, neopentyl glycol di(meth)acrylate, 1,6-hexanediol di(meth)acrylate, 1,9-nonanediol di(meth)acrylate, 1,10-decanediol di(meth)acrylate, glycerin di(meth)acrylate, 2-hydroxy-3-acryloyloxypropyl(meth)acrylate, dimethylol tricyclodecane di(meth)acrylate, trifluoroethyl (meth)acrylate, perfluorooctylethyl (meth)acrylate, isoamyl acrylate, lauryl acrylate, di(meth)acrylates of ethylene oxide adducts of bisphenol A, di(meth)acrylates of propyleneoxide adducts of bisphenol A, trimethylolpropane-benzoate-(meth)acrylate, bisphenol A diglycidyl di(meth)acrylate, adducts of toluene diisocyanate and 2-hydroxy-3-phenoxypropyl (meth)acrylate, trimethylol propane tri(meth)acrylate, tri(meth)acrylate of ethylene oxide modified trimethylol propane, pentaerythritoltri(meth)acrylate, pentaerythritoltetra(meth)acrylate, dipentaerythritolhexa(meth)acrylate, adducts of hexamethylene diisocyanate and pentaerythritol tri(meth)acrylate, adducts of toluene diisocyanate and pentaerythritol tri(meth)acrylate, adducts of isophorone diisocyanate and pentaerythritol tri(meth)acrylate, and adducts of hexamethylene diisocyanate and dipentaerythritol penta(meth)acrylate. These may be used alone or in combination thereof.

The isobornyl acrylate and/or the radical polymerization material including the same may be present in the anisotropic conductive film or composition in an amount of about 1 wt % to about 25 wt %, e.g., about 5 wt % to about 20 wt %, based on the total weight of the anisotropic conductive film or composition in terms of solid content.

Within this content range, the isobornyl acrylate and/or the radical polymerization material including the same may permit the entirety of a cured product to form a sufficient acrylate curing structure and may help prevent excessive increase in hardness of the cured product and deterioration in adhesive strength and peel strength between interfaces.

d) Conductive Particles

According to an embodiment, suitable conductive particles may be used.

Examples of the conductive particles may include metal particles such as gold (Au), silver (Ag), nickel (Ni), copper (Cu), and solder particles; carbon particles; resin particles, such as polyethylene, polypropylene, polyester, polystyrene, polyvinyl alcohol and modified resin particles thereof plated and coated with metals, such as gold (Au), silver (Ag), nickel (Ni), copper (Cu), and solder; and insulated conductive particles obtained by further coating insulating particles on the metal-coated polymer resin particles.

The conductive particles may have an average particle diameter depending on pitches of circuits, and may be selected in various ways in a range of about 1 μm to about 30 μm, as desired.

The conductive particles may be present in the anisotropic conductive film or composition an amount of about 0.1 wt % to about 15 wt %, e.g., about 0.1 wt % to about 10 wt % or about 1 wt % to about 10 wt %, based on the total weight of the anisotropic conductive film or composition in terms of solid content. Within this content range, the anisotropic conductive film may exhibit excellent connection characteristics and may help prevent failures in connection and/or isolation.

In an implementation, the anisotropic conductive film may further include organic particles and/or inorganic particles.

Organic Particles

According to an embodiment, suitable organic particles may be used.

Examples of the organic particles may include styrene-divinyl benzene, chlorinated polyethylene, dimethyl polysiloxane, methyl methacrylate-butyl acrylate-dimethylsiloxane copolymer, styrene-butadiene-styrene block copolymer, styrene-butadiene thermoplastic elastomer, butadiene rubber, styrene-butadiene rubber, ethylene glycidyl methacrylate particles, and the like. These may be used alone or in combination thereof.

In an implementation, styrene-divinyl benzene or styrene-butadiene rubber particles may be used. The organic particles may have an average particle diameter of about 0.1 μm to about 20 μm, e.g., about 0.1 μm to about 10 μm or about 1 μm to about 8 μm. Within this range, the organic particles may be suitably dispersed and may help prevent deterioration in pre-compression characteristics caused by a reduction in adhesion of the film.

The organic particles may be present in the anisotropic conductive film or composition in an amount of about 1 wt % to about 30 wt %, e.g., about 1 wt % to about 20 wt % or about 5 wt % to about 20 wt %, based on the total weight of the anisotropic conductive film or composition in terms of solid content. Within this content range, the organic particles may exhibit sufficient effects and may help prevent a significant increase in toughness of the film, thereby helping to prevent a deterioration in adhesion.

Inorganic Particles

When the anisotropic conductive film further includes inorganic particles, the inorganic particles may facilitate a uniform distribution of pressure applied to electrodes when the anisotropic conductive film is compressed on the electrodes, and may allow the anisotropic conductive film to have low moisture permeability and low hygroscopicity, while helping to improve bonding ability and connection reliability.

The inorganic particles may include, e.g., silica particles. The silica particles may have an average particle diameter of about 0.01 μm to about 10 μm, e.g., about 0.05 μm to about 5 μm or about 0.1 μm to about 1 μm.

The silica particles may be present in the anisotropic conductive film or composition in an amount of about 1 wt % to about 30 wt %, e.g., about 1 wt % to about 20 wt % or about 5 wt % to about 20 wt %, based on the total weight of the anisotropic conductive film or composition in terms of solid content. Within this content range, the silica particles may facilitate uniform distribution of pressure applied to electrodes when the anisotropic conductive film is compressed on the electrodes, and may allow the anisotropic conductive film to have low moisture permeability and low hygroscopicity, while improving bonding ability and connection reliability.

Curing Initiator

In an implementation, the anisotropic conductive film may further include a curing initiator. According to an embodiment, a suitable curing initiator may be used. Examples of the curing initiator may include peroxide-based (organic peroxides) and azo-based initiators.

Examples of the peroxide-based initiator may include acetylacetone peroxide, methylcyclohexanone peroxide, methylethylketone peroxide, 1,1-bis(t-butylperoxy)cyclohexane, 1,1-bis(t-butylperoxy)-2-methylcyclohexane, 1,1-bis(t-butylperoxy)-3,3,5-trimethylcyclohexane, n-butyl-4,4-bis(t-butylperoxy)valerate, 2,2-bis(t-butylperoxy)butane, t-butylhydroperoxide, (p-menthane hydroperoxide), 1,1,3,3-tetramethylbutylhydroperoxide, α',α'-bis(t-butylperoxy)diisopropylbenzene, 2,5-dimethyl-2,5-bis(t-butylperoxy)hexane, 2,5-dimethyl-2,5-bis(t-butylperoxy)hexine-3, benzoyl peroxide, lauroyl peroxide, stearoyl peroxide, succinic acid peroxide, 3,5,5-trimethylhexanoyl peroxide, di-2-ethoxyethyl peroxy dicarbonate, diisopropyl peroxy carbonate, di-3-methoxybutyl peroxy dicarbonate, di-2-ethylhexyl peroxy dicarbonate, bis(4-t-butylcyclohexyl)peroxy dicarbonate, t-butyl peroxyacetate, t-butyl peroxy-2-ethylhexyl monocarbonate, t-butyl peroxyisopropyl monocarbonate, t-butyl peroxylaurate, t-butyl peroxy maleic acid, t-butyl peroxy neodecanoate, t-butyl peroxy-2-ethylhexanoate, t-butyl peroxy pivalate, t-butyl peroxy benzoate, t-butyl peroxy-m-toluate/benzoate, t-butyl peroxy-3,3,5-trimethylhexanoate, α',α'-bis(neodecanoylperoxy)diisopropylbenzene, cumyl peroxy neodecanoate, 1-cyclohexyl-1-methylethyl peroxy neodecanoate, 2,5-dimethyl-2,5-bis(m-toluoylperoxy)hexane, 2,5-dimethyl-2,5-bis(2-ethylhexanoylperoxy)hexane, 2,5-dimethyl-2,5-bis (benzoylperoxy)hexane, t-hexyl peroxy isopropyl monocarbonate, t-hexyl peroxy neodecanoate, t-hexyl peroxy-2-ethylhexanoate, t-hexyl peroxy pivalate, 1,1,3,3-tetramethylbutyl peroxy-2-ethylhexanoate, 3,3',4,4'-tetra(t-butyl peroxy carbonyl)benzophenone, and the like. These may be used alone or in combination thereof.

Examples of the azo-based initiator may include 2,2'-azobis(4-methoxy-2,4-dimethyl valeronitrile), dimethyl 2,2'-azobis(2-methyl propionate), 2,2'-azobis(N-cyclohexyl-2-methyl propionamide), and the like. These may be used alone or in combination thereof.

The curing initiator may be present in the anisotropic conductive film or composition in an amount of about 0.1 wt % to about 15 wt %, e.g., about 0.1 wt % to about 10 wt % or about 0.5 wt % to about 5 wt %, based on the total weight of the anisotropic conductive film or composition in terms of solid content. Within this content range, the composition may be sufficiently cured in a short time and may have good compatibility, thereby allowing efficient formation of the anisotropic conductive film.

In an implementation, the anisotropic conductive film may further include an additive, e.g., polymerization inhibitors, anti-oxidants, heat stabilizers, curing accelerators, coupling agents, or the like, in order to provide additional properties to the film without deteriorating fundamental properties of the film. Amounts of these additives added may be determined in various ways according to the purpose and desired effects of the film, as desired.

A suitable method of preparing the anisotropic conductive film according to the embodiments may be used. No special apparatus or equipment may be required to form the anisotropic conductive film. For example, the anisotropic conductive film may be prepared by dissolving a binder resin in an organic solvent, adding other components for the anisotropic conductive film, stirring the mixture for a certain period of time at a rate that does not cause pulverization of the conductive particles, applying the mixture to an suitable thickness, e.g., about 10 μm to about 50 μm, to a release film, and drying the mixture for a sufficient time to vaporize the organic solvent.

When the anisotropic conductive film according to the embodiment is compressed onto an adherend, the anisotropic conductive film may have unevenness having a maximum height of about 2 μm or more on a rear surface of a compressed surface thereof, and may include isobornyl acrylate and conductive particles.

In addition, the unevenness may have an average height (Ra) of about 0.4 μm or more. In an implementation, the unevenness have a maximum height of about 2 μm or more and an average height of about 0.5 μm or more, e.g., a maximum height of about 2 μm or more, an average height of about 0.4 μm or more, and a standard deviation of about 0.55 or more.

Referring to FIG. 1, a maximum height (Rz) of the unevenness may refer to a distance (Rp+Rv) between a maximum peak point (Rp) and a maximum valley point (Rv) among unevenness in a graph obtained by measurement of the degree of surface roughness of the film. The average height (Ra) of the unevenness may mean an average value of total absolute values of the respective peaks and valleys in the graph.

Within this range, pressure may be uniformly distributed to the anisotropic conductive film upon compression of the conductive film to allow the film to be sufficiently adhered and connected to a corresponding substrate or device, and uniform indentations may be obtained upon primary compression.

An indentation state of the anisotropic conductive film may be measured by measuring an error range of the average height of the unevenness on the rear surface of the compressed surface of the anisotropic conductive film after compressing the anisotropic conductive film onto the adherend as described above.

Herein, indentation may refer to unevenness on the rear side of the compressed surface of the anisotropic conductive film actually attached to the adherend, when the anisotropic conductive film is compressed onto the adherend. Such indentations may act as a standard that directly or indirectly indicates uniform distribution of pressure applied to the anisotropic conductive film upon compression of the anisotropic conductive film. Accordingly, indentation testing may be used to determine whether the anisotropic conductive film is sufficiently bonded to a substrate or the like, and thus whether the corresponding semiconductor device is sufficiently connected thereby.

The indentation state may be measured by scanning a rear side of the compressed surface of an anisotropic conductive film using a surface shape measuring apparatus (2-D Surface Profiler, KAL-TENCOR) after primary compression of the anisotropic conductive film. Here, a load of 1 mg may be applied and the degree of surface roundness of the film is measured.

The indentation state may be evaluated through analysis of the graph of unevenness obtained by measurement of the degree of surface roundness of the film. Here, compression may be performed through pre-compression and primary compression of anisotropic conductive films onto a PCB (pitch: 200 μm, terminal width: 100 μm, distance between terminals: 100 μm, terminal height: 35 μm). Pre-compression may be performed at a temperature of about 50° C. to about 70° C. under a load of about 1.0 MPa to about 5.0 MPa for about 1 to about 5 seconds, e.g., under a load of about 1.0 MPa to about 3.0 MPa for about 1 to about 3 seconds. Primary compression may be performed at a temperature of about 110° C. to about 150° C. under a load of about 1.0 MPa to about 4.0 MPa for about 1 to about 7 seconds, e.g., under a load of about 1.5 MPa to about 3.5 MPa for about 1 to about 5 seconds. The adherend may be a PCB.

Further, the anisotropic conductive film according to an embodiment may have an adhesive strength of about 900 gf/cm or more, e.g., about 1,000 gf/cm, as measured after the anisotropic conductive film is subjected to primary compression at a temperature of about 110° C. to about 150° C. under a load of about 1.0 MPa to about 4.0 MPa for about 1 to about 7 seconds. As such, the anisotropic conductive film according to an embodiment may have low temperature rapid curing characteristics.

Adhesive strength of the anisotropic conductive film may be measured as follows. For example, a prepared anisotropic conductive film may be placed between a PCB (pitch: 200 μm, terminal width: 100 μm, distance between terminals: 100 μm, terminal height: 35 μm) and a COF (pitch: 200 μm, terminal width: 100 μm, distance between terminals: 100 μm, terminal height: 8 μm), and may be connected therebetween under the following conditions.

1) Pre-compression; 60° C., 1 second, 1.0 MPa
2) Primary compression; 130° C., 3 seconds, 2.5 MPa Then, the adhesive strength may be measured at a peel angle of 90° and a peel speed of 50 mm/min using a peel strength tester H5KT (Tinius Olsen).

Further, the anisotropic conductive film according to an embodiment may have an adhesive strength of about 800 gf/cm or more, e.g., about 900 gf/cm or more or about 1000 gf/cm or more, as measured after the anisotropic conductive film is subjected to primary compression at about 110° C. to about 150° C. under a load of about 1.0 MPa to about 4.0 MPa for about 1 to about 7 seconds and is left under conditions of 85° C. and 85% RH for 500 hours.

Accordingly, the anisotropic conductive film according to an embodiment may be highly reliable even after extended use under high temperature and high humidity conditions.

Adhesive strength of the anisotropic conductive film after reliability testing may be measured by the same method as the above method of measuring the adhesive strength after being left under conditions of 85° C. and 85% RH for 500 hours.

Another embodiment provides a semiconductor device. The semiconductor device may include a first connecting member including a first electrode; a second connecting member including a second electrode; and the anisotropic conductive film according to an embodiment between the first connecting member and the second connecting member and electrically connecting the first electrode and the second electrode to each other.

Figure 2:
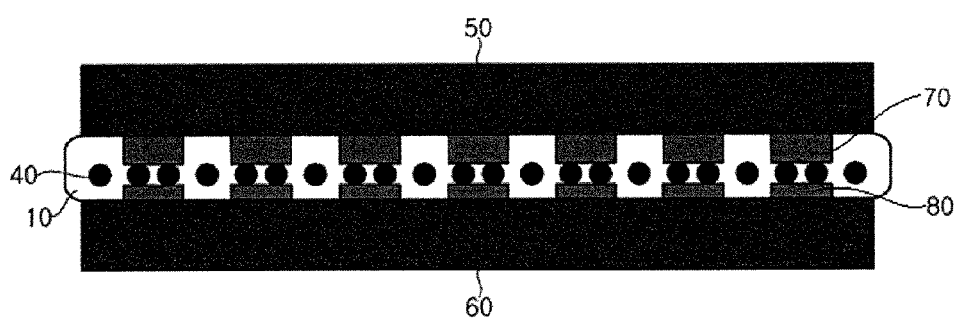
FIG. 2 illustrates a sectional view of a semiconductor device connected with an anisotropic conductive film according to an embodiment.

Referring to FIG. 2, the semiconductor device according to an embodiment may include first and second connecting members 50, 60 connected to each other via an anisotropic conductive adhesive film 10 according to an embodiment and including first and second electrodes 70, 80, respectively. Here, when the anisotropic conductive adhesive film 10 is compressed between the first connecting member 50 having the first electrode 70 and the second connecting member 60 having the second electrode 80, the first electrode 70 and the second electrode 80 may be electrically connected to each other through conductive particles 40 in the anisotropic conductive adhesive film 10.

For example, referring to FIG. 2, the semiconductor device according to an embodiment may include a first connecting member 50 including a first electrode 70; a second connecting member 60 including a second electrode 80; and an anisotropic conductive film 10 including conductive particles 40. When the anisotropic conductive film 10 placed between the first connecting member 50 having the first electrode 70 and the second connecting member 60 having the second electrode 80 is compressed, the first electrode 70 and the second electrode 80 may be connected to each other via the conductive particles 40. In an implementation, the first and second connecting members 50, 60 may have similar structures in terms of material, thickness, size and interconnectivity. The first and second connecting members 50, 60 may have a thickness of about 20 μm to about 100 μm.

In an implementation, the first and second connecting members may have different structures and functions in terms of material, thickness, size and interconnectivity. The first connecting member or the second connecting member may be formed of, e.g., glass, PCB (Printed Circuit Board), fPCB (Flexible Printed Circuit Board), COF (Chip On Film), TCP (Tape Carrier Package), ITO (Indium Tin Oxide) glass, or the like. The first electrode or the second electrode may be a protruding electrode or a flat electrode. When the first and second electrodes are protruding electrodes, a gap (G) may be formed therebetween, and these electrodes may have a height (H) of about 2.50 μm to about 10 μm, a width (W) of about 50 μm to about 120 μm, and a gap (G) of about 50 μm to about 110 μm. In an implementation, the electrodes may have a height (H) of about 2.50 μm to about 9 μm, a width (W) of about 50 μm to about 100 μm, and a gap (G) of about 60 μm to about 90 μm.

When the first and second electrodes are flat electrodes, these electrodes may have a thickness of about 500 Å to about 1,200 Å. The first or second electrode may be formed of, e.g., ITO, copper, silicon, IZO, and the like, without being limited thereto.

The flat electrodes may have a thickness of about 800 Å to about 1,200 Å, and the protruding electrodes have a height of about 6 μm to about 10 μm. In this case, when an insulating layer has a thickness of about 4 μm to about 12 μm, the film may exhibit sufficient adhesion. For example, the flat electrodes may have a thickness of about 1,000 Å and the protruding electrodes may have a height of 8 μm. In this case, the insulating layer may have a thickness of about 6 μm to about 10 μm.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Example 1

(1) Preparation of Anisotropic Conductive Film Composition

An anisotropic conductive film composition was prepared by mixing 60 wt % of polyurethane acrylate having a weight average molecular weight of 25,000 g/mol; 10 wt % of an ethylene-vinyl acetate copolymer resin (Evaflex EV 180, Mitsubishi Dupont Polychemical Co. Ltd.); 10 wt % of isobornyl acrylate (IBOA, ALDRICH); 15 wt % of a polystyrene divinyl benzene copolymer having an average particle diameter of 3 μm as organic particles; 2 wt % of benzoyl peroxide (Hansol) as an organic peroxide; and 3 wt % of conductive particles (Ni) having an average particle diameter of 3 μm. Here, the polyurethane acrylate was prepared by polymerization of 60 wt % of a polyol in the presence of hydroxy methacrylate/isocyanate (molar ratio: 0.5) in 50 vol % of methylethylketone provided as a solvent using dibutyltin dilaurylate as a catalyst at 90° C. and 1 atm. for 5 hours. In addition, the ethylene-vinyl acetate copolymer resin was prepared to have a solid content of 35% by dissolving 80 g of an ethylene-vinyl acetate copolymer containing 33 wt % of vinyl acetate in a solvent mixture of toluene and methylethylketone mixed in a weight ratio of 2:1.

Further, the organic particles were prepared as follows. In a 3-neck round bottom flask equipped with a chiller, 100 ml of acetonitrile was placed as a solvent under nitrogen atmosphere, a styrene monomer and divinyl benzene were added in an amount of 2 wt % based on the solvent. Here, the divinyl benzene was added as a crosslinking agent in an amount of 50 wt % based on the styrene monomer. Then, the mixture was maintained at 70° C. Then, as an initiator, 0.04 g of 2,2'-azobisisobutyronitrile was added to the mixture, followed by stirring at 30 rpm for 24 hours to prepare organic particles through precipitation polymerization.

(2) Preparation of Anisotropic Conductive Film

The prepared composition was stirred at a rate that did not cause pulverization of the conductive particles at room temperature (~25° C.) for 60 minutes. Then, the resulting material was applied to a polyethylene film (subjected to silicone release treatment) to form a 35 μm thick film. In formation of the film, a casting knife was used, and the film was dried at 60° C. for 5 minutes.

Example 2

An anisotropic conductive film was prepared in the same manner as in Example 1 except that 55 wt % of the polyurethane acrylate and 15 wt % of the ethylene-vinyl acetate copolymer resin were used.

Example 3

An anisotropic conductive film was prepared in the same manner as in Example 1 except that 70 wt % of the polyurethane acrylate, 5 wt % of the ethylene-vinyl acetate copolymer resin, and 5 wt % of the isobornyl acrylate were used.

Example 4

An anisotropic conductive film was prepared in the same manner as in Example 1 except that 65 wt % of the polyurethane acrylate, 15 wt % of the ethylene-vinyl acetate copolymer resin, and 15 wt % of the isobornyl acrylate were used.

Example 5

An anisotropic conductive film was prepared in the same manner as in Example 1 except that, instead of using the ethylene-vinyl acetate copolymer resin, 15 wt % of an acrylonitrile-α-methylstyrene resin (AP-TJ, Cheil Industries Inc.) dissolved in 40 vol % of toluene/methylethylketone and having a weight average molecular weight of 133,000 g/mol, 5 wt % of the isobornyl acrylate, and 15 wt % of the organic particles were used.

Example 6

An anisotropic conductive film was prepared in the same manner as in Example 1 except that, instead of using the ethylene-vinyl acetate copolymer resin, 20 wt % of an acrylonitrile-butadiene copolymer resin (1072CGX, Zeon Chemical Co., Ltd.) dissolved in 25 vol % of toluene/methylethylketone, 5 wt % of the isobornyl acrylate, and 10 wt % of the organic particles were used.

Comparative Example 1

An anisotropic conductive film was prepared in the same manner as in Example 1 except that, in place of the isobornyl acrylate, an epoxy acrylate polymer (SP1509, Showa Polymer) was used.

The compositions of the anisotropic conductive films prepared in Examples 1 to 6 and Comparative Examples 1 are shown in Table 1, below.

TABLE 1

|   | Composition | Example 1 | Example 2 | Example 3 | Example 4 | Example 5 | Example 6 | Comparative Example 1 |
|---|---|---|---|---|---|---|---|---|
| (a) | Polyurethane acrylate | 60 | 55 | 70 | 65 | 60 | 60 | 60 |
| (b) | EVA copolymer resin | 10 | 15 | 5 | 15 | — | — | 10 |
|   | NBR copolymer resin | — | — | — | — | — | 20 | — |
|   | Styrene resin | — | — | — | — | 15 | — | — |
| (c) | Isobornyl acrylate | 10 | 10 | 5 | 15 | 5 | 5 | — |
|   | (a + b + c)/c:(X/Y) | 8 | 8 | 16 | 6.33 | 16 | 16 | — |
|   | Epoxy acrylate polymer | — | — | — | — | — | — | 10 |
|   | Organic particles | 15 | 15 | 15 | — | 15 | 10 | 15 |
|   | Organic peroxide | 2 | 2 | 2 | 2 | 2 | 2 | 2 |
|   | Conductive particles | 3 | 3 | 3 | 3 | 3 | 3 | 3 |
|   | Total | 100 | 100 | 100 | 100 | 100 | 100 | 100 |

Experimental Example 1

Initial and Post-Reliability Test Adhesive Strength

To measure adhesive strength of each of the anisotropic conductive films prepared in Examples 1 to 6 and Comparative Examples 1, each of the anisotropic conductive films was placed between a PCB (pitch: 200 μm, terminal width: 100 μm, distance between terminals: 100 μm, terminal height: 35 μm) and a COF (pitch: 200 μm, terminal width: 100 μm, distance between terminals: 100 μm, terminal height: 8 μm), and was connected therebetween under the following conditions.

1) Pre-compression: 60° C., 1 second, 1.0 MPa
2) Primary compression: 130° C., 3 seconds, 2.5 MPa After preparing 5 specimens for each anisotropic conductive film under these conditions, adhesive strength of each of the specimens was measured at a peel angle of 90° and a peel speed of 50 mm/min using a peel strength tester H5KT (Tinius Olsen). An average adhesive strength for each anisotropic conductive film was calculated.

Next, each of the 5 specimens was left at 85° C. and 85% RH for 500 hours to perform reliability testing under high temperature/high humidity conditions, followed by measurement of post-reliability test adhesive strength for each of the specimens in the same manner as mentioned above. Then, an average value was calculated.

Experimental Example 2

Initial and Post-Reliability Test Connection Resistance

To measure connection resistance of each of the anisotropic conductive films prepared in Examples 1 to 6 and Comparative Examples 1, each of the anisotropic conductive films was placed between a PCB (pitch: 200 μm, terminal width: 100 μm, distance between terminals: 100 μm, terminal height: 35 μm) and a COF (pitch: 200 μm, terminal width: 100 μm, distance between terminals: 100 μM, terminal height: 8 μm), and was connected therebetween under the following conditions.

1) Pre-compression: 60° C., 1 second, 1.0 MPa
2) Primary compression: 130° C., 3 seconds, 2.5 MPa After preparing 5 specimens for each anisotropic conductive film under these conditions, initial connection resistance of each specimen was measured by a 4-probe measurement method (in accordance with ASTM F43-64T), and an average value thereof was calculated.

Next, each of the 5 specimens was left at 85° C. and 85% RH for 500 hours to perform reliability testing under high temperature/high humidity conditions, followed by measurement of post-reliability test connection reliability for each of the specimens (in accordance with ASTM D117). Then, an average value was calculated.

Experimental Example 3

Indentation State

To evaluate an indentation state of each of the anisotropic conductive films prepared in Examples 1 to 6 and Comparative Examples 1, the following experiment was performed.

Each of the anisotropic conductive films was compressed onto a PCB (pitch: 200 μm, terminal width: 100 μm, distance between terminals: 100 μm, terminal height: 35 μm) under the following conditions.

1) Pre-compression: 60° C., 1 second, 1.0 MPa
2) Primary compression: 130° C., 3 seconds, 2.5 MPa After compressing the anisotropic conductive film under these conditions, the degree of surface roundness of the anisotropic conductive film was measured by scanning the rear side of the compressed surface of the film using a surface shape measuring apparatus, 2-D Surface Profiler (KAL-TENCOR), by applying a load of 1 mg.

The indentation state of each anisotropic conductive film was evaluated through analysis of a graph of unevenness obtained by measuring the degree of surface roundness. Evaluation of the indentation state was carried out by obtaining a maximum height (Rz), an average height (Ra), and a standard deviation of unevenness.

TABLE 2

| Properties | | Example 1 | Example 2 | Example 3 | Example 4 | Example 5 | Example 6 | Comparative Example 1 |
|---|---|---|---|---|---|---|---|---|
| Adhesive strength (gf/cm) | Initial | 1034 | 1127 | 1028 | 1101 | 1096 | 1096 | 387 |
| | Post reliability test | 1230 | 1315 | 1105 | 1098 | 1204 | 1148 | 240 |
| Connection resistance (Ω) | Initial | 0.29 | 0.30 | 0.31 | 0.23 | 0.29 | 0.28 | 0.29 |
| | Post reliability test | 0.41 | 0.39 | 0.40 | 0.41 | 0.40 | 0.43 | 0.42 |
| Maximum height (Rz) of unevenness (μm) | | 3.92 | 3.07 | 4.12 | 2.98 | 2.24 | 2.31 | 1.68 |
| Average height (Ra) of unevenness (μm) | | 1.09 | 0.83 | 1.22 | 0.79 | 0.51 | 0.52 | 0.36 |
| Standard deviation of unevenness | | 1.23 | 0.96 | 1.30 | 0.90 | 0.62 | 0.63 | 0.53 |

By way of summation and review, in order to secure sufficient adhesion and connection reliability with respect to a substrate, an anisotropic conductive film may be subjected to compression at high temperature for a long period of time before the film is used to connect a semiconductor device. In order to prevent damage to the semiconductor device while improving productivity by reducing impact to a substrate upon connection of the semiconductor device, temperature and time for connection may be decreased.

On the other hand, as a method for determining whether an anisotropic conductive film is sufficiently adhered to a substrate upon connection of a semiconductor device using the anisotropic conductive film, an indentation state may be observed.

Indentations may refer to unevenness formed on a rear side of a compressed surface of an anisotropic conductive film actually attached to an adherend and compressed thereon. Such indentations may act as a standard that directly or indirectly indicates uniform distribution of pressure applied to the anisotropic conductive film upon compression of the anisotropic conductive film. Thus, uniform formation of the indentations may be desirable.

When a binder resin having high elastic modulus, e.g., a urethane resin, is used in preparation of an anisotropic conductive film capable of being cured rapidly at low temperature, the prepared film may exhibit improved adhesion at low temperature. In this case, however, non-uniform pressure distribution may occur in the course of film compression and a severely rounded indentation may be formed on the surface of the film, thereby causing connection failure of the semiconductor device and deterioration in long term reliability of the anisotropic conductive film.

The embodiments may provide an anisotropic conductive film that exhibits excellent adhesion at low temperature while providing a uniform indentation state.

The embodiments may provide a semiconductor device connected by an anisotropic conductive film, the film exhibiting strong adhesion upon bonding at low temperature and high reliability even after extended use under high temperature and high humidity conditions.

The embodiments may provide a semiconductor device connected by an anisotropic conductive film, the film being capable of being cured rapidly at low temperature and exhibiting an excellent indentation state after compressing.

The anisotropic conductive film according to an embodiment may be capable of being cured rapidly at low temperature and exhibiting an excellent indentation state.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A device, comprising:
a first connecting member that includes a first electrode;
a second connecting member that includes a second electrode; and
an anisotropic conductive film connecting the first connecting member and the second connecting member, wherein the first connecting member is one of a glass substrate, a PCB, a fPCB, a COF, a TCP or an ITO glass substrate, the second connection member is one of a glass substrate, a PCB, a fPCB, a COF, a TCP or an ITO glass substrate, and the anisotropic conductive film is between the first connecting member and the second connecting member, the anisotropic conductive film comprising:
about 30 wt % to about 80 wt % of a polyurethane resin;
about 1 wt % to about 40 wt % of at least one other resin selected from the group of an ethylene-vinyl acetate copolymer resin, an acrylonitrile resin, and a styrene resin;
about 5 wt % to 15 wt % of isobornyl acrylate; and
about 0.1 wt % to about 15 wt % of conductive particles, all amounts being in terms of solid content, wherein:
the polyurethane resin, the at least one other resin, and the isobornyl acrylate are present in a ratio (X/Y) of a total weight (X) of the polyurethane resin, the at least one other resin, and the isobornyl acrylate to a weight (Y) of the isobornyl acrylate in the range of 6.33 to about 20, in terms of solid content,
unevenness on a rear side of a compressed surface of the anisotropic conductive film has a maximum height of about 2 μm or more and has an average height of about 0.4 μm or more, when the anisotropic conductive film is compressed onto an adherend under following conditions:
(a) pre-compression: at about 50° C. to about 70° C. for about 1 to about 5 seconds under a load of about 1.0 Mpa to about 5.0 Mpa, and
(b) primary compression: at about 110° C. to about 150° C. for about 1 to about 7 seconds under a load of about 1.0 Mpa to about 4.0 Mpa, and
the anisotropic conductive film has an adhesive strength of about 800 gf/cm or more, as measured after being subjected to a primary compression at about 110° C. to about 150° C. for about 1 to about 7 seconds under a load of about 1.0 MPa to about 4.0 MPa and then left at 85° C. and 85% RH for 500 hours.

2. The device as claimed in claim 1, wherein the unevenness on the rear side of the compressed surface of the anisotropic conductive film has a maximum height of about 2 μm to about 4.12 μm.

3. The device as claimed in claim 1, wherein the unevenness on the rear side of the compressed surface of the anisotropic conductive film has an average height of about 0.4 μM to about 1.22 μm.

4. The device as claimed in claim 1, wherein the adherend is a printed circuit board.

5. The device as claimed in claim 1, wherein a total amount of the polyurethane resin and the at least one other resin in the anisotropic conductive film is about 60 wt % to about 90 wt %, based on a total weight of the anisotropic conductive film in terms of solid content.

6. The device as claimed in claim 1, wherein the isobornyl acrylate is present in the anisotropic conductive film in an amount of about 1 wt % to about 25 wt %, based on a total weight of the anisotropic conductive film in terms of solid content.

7. The device as claimed in claim 1, wherein the anisotropic conductive film further includes organic particles or inorganic particles.

8. The device as claimed in claim 7, wherein the organic particles or inorganic particles are present in the anisotropic conductive film in an amount of about 1 wt % to about 30 wt %, based on a total weight of the anisotropic conductive film in terms of solid content.

9. The device as claimed in claim 7, wherein the anisotropic conductive film includes:
55 wt % to 70 wt % of polyurethane acrylate;
5 wt % to 15 wt % of the at least one other resin selected from the group of an ethylene-vinyl acetate copolymer resin, an acrylonitrile resin, and a styrene resin;
the 5 wt % to 15 wt % of the isobornyl acrylate;
10 wt % to 15 wt % of the organic particles, and
the about 0.1 wt % to about 15 wt % of the conductive particles, all amounts being in terms of solid content.

* * * * *